(12) United States Patent
Hofmann et al.

(10) Patent No.: US 10,217,211 B2
(45) Date of Patent: Feb. 26, 2019

(54) METHOD AND DEVICE FOR THE PLACEMENT OF ELECTRONIC COMPONENTS

(71) Applicant: ERSA GmbH, Wertheim (DE)

(72) Inventors: Udo Hofmann, Roellbach (DE); Wolfram Sinn, Offenbach (DE); Sergei Richter, Neckartenzlingen (DE)

(73) Assignee: ERSA GmbH, Wertheim (DE)

( * ) Notice: Subject to any disclaimer, the term of this patent is extended or adjusted under 35 U.S.C. 154(b) by 182 days.

(21) Appl. No.: 15/297,419

(22) Filed: Oct. 19, 2016

(65) Prior Publication Data
US 2017/0116720 A1 Apr. 27, 2017

(30) Foreign Application Priority Data
Oct. 23, 2015 (DE) .......................... 10 2015 220 746

(51) Int. Cl.
*G06T 7/00* (2017.01)
*G06T 7/73* (2017.01)
(Continued)

(52) U.S. Cl.
CPC ............... *G06T 7/001* (2013.01); *G06T 7/74* (2017.01); *H05K 13/0053* (2013.01);
(Continued)

(58) Field of Classification Search
CPC ........... G06T 7/001; G06T 7/74; G06T 7/254; G06T 2207/30141; G06T 2207/30152;
(Continued)

(56) References Cited

U.S. PATENT DOCUMENTS 5,694,219 A 12/1997 Kim
6,557,251 B2 * 5/2003 Hudson ............ H01L 21/67144
29/407.04
(Continued)

FOREIGN PATENT DOCUMENTS

DE 19857263 A1 3/2000
DE 102013207598 A1 10/2014

OTHER PUBLICATIONS

English Language Abstract of DE 10 2013 207 598 which corresponds to US 2016 0091869.
English Language Abstract of DE 198 57 263 A1.

*Primary Examiner* — Michael S Osinski
(74) *Attorney, Agent, or Firm* — Ware, Fressola, Maguire & Barber LLP

(57) ABSTRACT

A method for placing electronic components onto a circuit board, comprising the following steps: Placing a component to be placed of a first component type into a starting position; creating a component image of the component to be placed in the starting position; creating a circuit board region image of a circuit board of a first circuit board region type; calculating a travel path for moving the component to be placed into a final position on the circuit board based upon an image overlay of the component image and a previously saved reference component image of a reference component of the first component type, and based upon a previously saved reference travel path of the reference component from a reference starting position into a reference final position on a reference circuit board of the first circuit board region type, and based upon an image overlay of the circuit board region image and a previously saved reference circuit board region image of the reference circuit board; moving the component to be placed along the travel path into the final position.

19 Claims, 3 Drawing Sheets

(51) Int. Cl.
  *H05K 13/00* (2006.01)
  *H05K 13/04* (2006.01)
  *H05K 13/08* (2006.01)

(52) U.S. Cl.
  CPC ....... *H05K 13/0486* (2013.01); *H05K 13/089* (2018.08); *H05K 13/0818* (2018.08); *H05K 13/0853* (2018.08); *G06T 2207/30141* (2013.01)

(58) Field of Classification Search
  CPC ... H01L 2224/83121; H01L 2224/7565; H01L 2224/75804; H01L 2224/75802; H01L 2224/757–2224/75754; H01L 2223/54426; H05K 13/08; H05K 13/0015; H05K 13/0061; H05K 13/0413; H05K 13/0404; H05K 13/0452; Y10T 29/49131; Y10T 29/53174; Y10T 29/53178; G06K 2209/19; G06F 17/5045; G06F 17/5081
  See application file for complete search history.

(56) References Cited

U.S. PATENT DOCUMENTS

| | | | | |
|---|---|---|---|---|
| 7,542,151 B2 * | 6/2009 | Van Gastel | | H05K 13/08 29/712 |
| 7,706,595 B2 * | 4/2010 | Bushman | | H05K 13/08 382/141 |
| 7,841,079 B2 * | 11/2010 | Inoue | | H05K 3/303 29/739 |
| 8,646,174 B2 * | 2/2014 | Kaida | | H05K 13/0413 29/831 |
| 8,720,331 B2 * | 5/2014 | Abe | | B41F 15/26 101/114 |
| 8,903,541 B2 * | 12/2014 | Vangilbergen | | G01B 11/03 29/833 |
| 9,332,681 B2 * | 5/2016 | Mantani | | H05K 13/0015 |
| 9,332,686 B2 * | 5/2016 | Yamashita | | H05K 13/0015 |
| 9,661,793 B2 * | 5/2017 | Itoh | | H05K 13/0015 |
| 9,780,514 B2 * | 10/2017 | Mimura | | H01R 43/048 |
| 9,921,552 B2 * | 3/2018 | Winkler | | H05K 13/08 |
| 2003/0070289 A1 * | 4/2003 | Hwang | | H05K 13/0452 29/833 |
| 2004/0049758 A1 * | 3/2004 | Ueda | | B23K 1/0016 29/832 |
| 2006/0018531 A1 * | 1/2006 | Murakami | | G01N 21/8851 382/145 |
| 2006/0283011 A1 * | 12/2006 | Muller | | H05K 13/0015 29/834 |
| 2007/0145102 A1 * | 6/2007 | Blessing | | H05K 13/0413 228/101 |
| 2007/0165247 A1 * | 7/2007 | Van Gastel | | H05K 13/08 356/614 |
| 2008/0289175 A1 * | 11/2008 | Inoue | | H05K 3/303 29/840 |
| 2010/0011569 A1 * | 1/2010 | Dietrich | | H01L 21/67121 29/740 |
| 2010/0142799 A1 * | 6/2010 | Minamide | | H05K 13/08 382/145 |
| 2011/0315028 A1 * | 12/2011 | Abe | | B41F 15/26 101/114 |
| 2013/0133188 A1 * | 5/2013 | Suter | | H05K 13/0404 29/740 |
| 2013/0147942 A1 * | 6/2013 | Lin | | G06K 9/2054 348/87 |
| 2013/0286186 A1 * | 10/2013 | Okada | | H05K 13/0404 348/87 |
| 2014/0071580 A1 * | 3/2014 | Higginson | | B81C 99/002 361/234 |
| 2015/0013154 A1 * | 1/2015 | Imoto | | G05B 19/4015 29/833 |
| 2015/0222071 A1 * | 8/2015 | Mimura | | H01L 24/27 29/838 |
| 2015/0324507 A1 * | 11/2015 | Takami | | G06F 17/5081 716/107 |
| 2015/0371883 A1 * | 12/2015 | Takahashi | | H01L 21/67259 438/5 |
| 2016/0091869 A1 | 3/2016 | Winkler et al. | | |
| 2016/0139513 A1 * | 5/2016 | Tsujikawa | | G03F 9/7046 355/67 |
| 2018/0035582 A1 * | 2/2018 | Murai | | H05K 13/08 |
| 2018/0047603 A1 * | 2/2018 | Kuwahara | | H01L 21/68 |

* cited by examiner

METHOD AND DEVICE FOR THE PLACEMENT OF ELECTRONIC COMPONENTS

BACKGROUND OF THE INVENTION

1. Field of the Invention

The invention relates to a method and a device for placing electronic components onto a circuit board.

2. Brief Description of Related Art

In so-called rework systems, electronic circuit boards, assemblies, or printed circuit boards (PCBs) are repaired or serviced. For this purpose, using heat sources, individual electronic components or surface-mounted devices (SMDs) are unsoldered from the circuit board or a printed circuit board (PCB) and resoldered again.

It is known from the prior art to hold the electronic components using a gripping device and to have a user create an optical overlay between a component bottom side and a circuit board top side by means of a camera-controlled live image prior to re-depositing the electronic components. As soon as the overlay created by the user reaches an optimum, the component is deposited onto the circuit board by the gripping device. This approach is, however, disadvantageous in that the quality of the component alignment or the component placement on the circuit board depends significantly upon the experience and qualification of the user, so that a precise component alignment or component placement on the circuit board can only be carried out by experienced users.

For automatic component alignment or component placement, it is further known to take one image each of the component bottom side and the circuit board top side and to detect pins of the electronic components and contact surfaces of the circuit boards to be contacted by means of computerized image processing, and to align the electronic components on the circuit board based upon the result of this image processing, such that the pins detected by means of image processing are overlaid with the contact surfaces detected by means of image processing.

This approach does, however, have disadvantages, since such an automated component alignment or component placement does not always function reliably. With a multitude of components and circuit boards, the component alignment or component placement is not always performed reliably due to interference, which may, for example, be caused by the lighting, the circuit board structure, or the component structure, so that ultimately a manually controlled alignment must be performed by a user, the accuracy of which significantly depends upon the qualification and experience of the respective user.

SUMMARY OF THE INVENTION

The invention is therefore based upon the aim of providing a method and a device for placing electronic components which avoids the disadvantages mentioned, i.e., in particular, of providing a method and a device for placing electronic components by means of which a large number of components can be easily and precisely aligned on a circuit board.

This aim is achieved by a method for placing electronic components on a circuit board. The method according to the invention comprises the following steps: Placing a component to be placed of a first component type into a starting position; creating a component image of the component to be placed; creating a circuit board region image of a circuit board of a first circuit board region type; calculating a travel path for moving the component to be placed from the starting position into a final position on the circuit board, based upon an image overlay of the component image and a previously saved reference component image of a reference component of the first component type, and based upon a previously saved reference starting position, a previously saved reference travel path of the reference component from the reference starting position into a reference final position on a reference circuit board of the first circuit board region type, and based upon an image overlay of the circuit board region image and a previously saved reference circuit board region image of the reference circuit board; moving the component to be placed along the travel path into the final position.

In contrast to the prior art, there is thus no computerized image processing in which pins of the electronic components and the contact surfaces of the circuit boards to be contacted are detected and then overlaid. Rather, the travel path is calculated based upon a saved reference travel path of a reference component of a first component type on a reference circuit board of a first circuit board region type. Minor deviations in the placement of components of the first component type to be placed onto circuit boards of the first circuit board region type, as well as of the circuit boards themselves, can be compensated for by the image overlay of the component image and the reference component image in the reference starting position, as well as by the image overlay of the circuit board region image and the reference circuit board region image. The image overlay can therefore be performed in a particularly advantageous manner without interference, since an image overlay is respectively performed only between the component image and a thereto identical or almost identical reference component image of a component type, as well as between a circuit board region image and a thereto identical or almost identical reference circuit board region image of a circuit board region type. It has been shown that the image overlay of identical or almost identical images can be performed more reliably.

The term "component type" in this respect refers to similar components that are identical or almost identical. The term "circuit boards of a circuit board region type" refers to circuit boards that comprise a similar region that is identical or almost identical to regions of other circuit boards. The method can therefore also be performed for a second or third component type and a second or third circuit board region type, etc.

A particular preferred embodiment of the method provides for creating a reference component image prior to saving the reference component image and the reference starting position, and for placing a reference component into the reference starting position, wherein the reference component is then moved along the reference travel path from the reference starting position into the reference final position on the reference circuit board, and wherein the reference travel path is saved when the reference component arrives at the reference final position. Consequently, a reference component of the first component type to be placed onto a reference circuit board of the first circuit board region type is taught, so that a subsequent placement of electronic components of the first component type on circuit boards of the first circuit board region type can be performed automatically. Such a teaching is also called a "teach-in" in expert circles. Advantageously, a reference circuit board region image of the reference circuit board is also created and saved during the teaching.

In this process, it has been shown to be particularly advantageous if the movement of the reference component from the reference starting position into the reference final position is performed manually. The term "manual movement" in this respect refers to a manual control of an operation panel of a traversing unit by an operator. In the process, it is particularly advantageous if the movement of the reference component from the reference starting position into the reference final position is performed by a particularly experienced user with good eyes, so that the placement of the reference component onto the reference circuit board occurs as precisely as possible.

It is furthermore particularly preferable that the calculation of the travel path be performed by means of a coordinate transformation and consist of a rotation and translation of the image overlay of the component image and the reference component image, a rotation and translation of the reference travel path, as well as a rotation and translation of the image overlay of the circuit board region image and the reference circuit board region image.

Another advantageous embodiment of the method provides for the component to be placed to be gripped and lifted by the gripping device prior to being moved.

Advantageously, after the movement, the component to be placed is deposited onto the circuit board into the final position or is dropped into the final position on the circuit board. In doing so, it is possible for the gripping device to release the component from a previously defined height, so that the component drops into the final position on the circuit board with the aid of gravity.

In order to simplify the creation of the component image or the reference component image of a component bottom side, it is particularly advantageous if the placement of the component into the starting position takes place on a glass plate. In this case, the component image and/or the reference component image are created in the starting position. For manual placement, in particular, of the component or the reference component onto the glass plate by a user, the glass plate, advantageously, has marks for positioning the components or reference components.

In addition to the marks for positioning the components, the glass plate may have so-called fiducial marks that may be used for a so-called mapping and that are used in mapping to support a comparison of a camera directed at the component from above with a camera directed at the component from below, such that the component image or reference component image can be included in an image of the component or reference component that was created of the component top side.

It is particularly advantageous if the components and circuit boards are respectively marked such that a component orientation can be detected by means of a camera. For this purpose, it can, in particular, be provided that components and circuit board, which are as a rule designed to be rectangular, have a visual mark in the region of a corner, by means of which visual mark the component orientation can be determined by means of a camera. For example, it can be provided for this purpose that the components have a so-called pin 1 identifier. If the glass plate has marks for positioning the components, it is particularly preferred that the marks be so designed that they indicate a basic position for the positioning of the components. This is particularly advantageous, since it has been shown that the method according to the invention works particularly well if components are arranged on the glass plate with an angular offset of less than 45° with respect to the basic position.

It is furthermore particularly preferred if the circuit board region image and the reference circuit board region image are taken of a circuit board top side.

The aim mentioned at the beginning is also achieved by a device for placing electronic components, which is designed for the purpose of performing the method according to the present invention. This device is characterized in that the device comprises at least one—and preferably, two—cameras designed to create the component image, the reference component image, the circuit board region image, and the reference circuit board region image, that the device comprises a control unit designed to calculate the travel path, that the control unit comprises a storage unit designed to store the reference component image, the reference starting position, the reference travel path, and the reference circuit board region image, and that the device comprises a gripping device for gripping the components to be placed.

An advantageous embodiment of the device provides that the device comprise a drive unit that is designed to move the gripping device along the travel path. It is particularly preferred in this respect if the gripping device is preferably designed to be able to move along at least three axes. Advantageously, the drive unit for moving the gripping device along the travel path can be controlled by the control unit.

A particularly advantageous embodiment of the device provides that the gripping device comprises a vacuum-operated, low-pressure gripping device. By means of such a low-pressure gripping device, the components can be lifted at the starting position, moved along the travel path using the drive unit, and deposited at the final position. Such a vacuum-operated, low-pressure gripping device is also called a placement nozzle in expert circles. The low-pressure gripping device or placement nozzle is advantageously replaceable, wherein a placement nozzle of the first nozzle type is used for components of the first component type, and, where applicable, a placement nozzle of a second nozzle type is used for components of a second component type. For identifying the various nozzle types, it can be provided that the placement nozzle have identifying features that can be identified visually. By means of the low-pressure gripping device, components to be placed can advantageously be gripped or suctioned in from a component top side. It is, however, also conceivable that the gripping device be designed as a gripper having gripper jaws, by means of which the components to be placed can be gripped at a component side or component edge.

An advantageous development of the device provides that the device comprises a glass plate for placing the components into the starting position. The use of a glass plate for placing the components is particularly advantageous, since the component image and the reference component image can thus be created from a component bottom side in a simple manner. For the placement of the components, the glass plate advantageously has marks for positioning the components.

In order to prevent the circuit boards from slipping out of place in the device, it is particularly advantageous if the device comprises a circuit board holder that is designed for the stationary mounting of the circuit boards.

Additional details and advantageous developments are to be taken from the description below, by reference to which the invention is described and explained in more detail.

BRIEF DESCRIPTION OF THE DRAWING

The drawing includes FIGS. 1-5, as follows.

DETAILED DESCRIPTION OF THE BEST MODE OF THE INVENTION

FIGS. 1 through 5 are used as a whole for describing a device 10 according to the invention, as well as a method according to the invention. Corresponding components and elements are provided with corresponding reference symbols in the figures.

Figure 1:
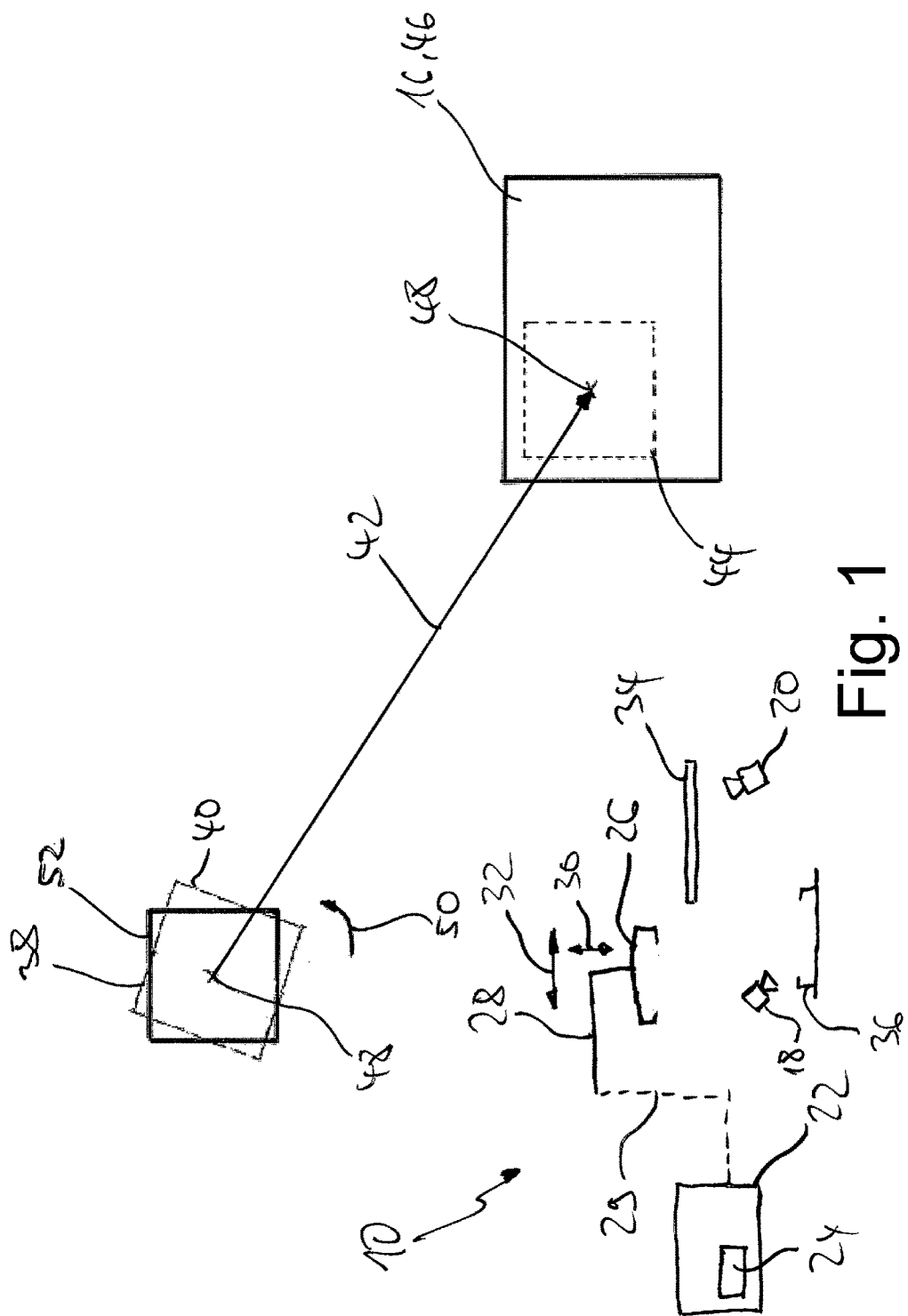
FIG. 1. A schematic representation of a device according to the invention for placing electronic components onto a circuit board during the so-called teaching.
Figure 2:
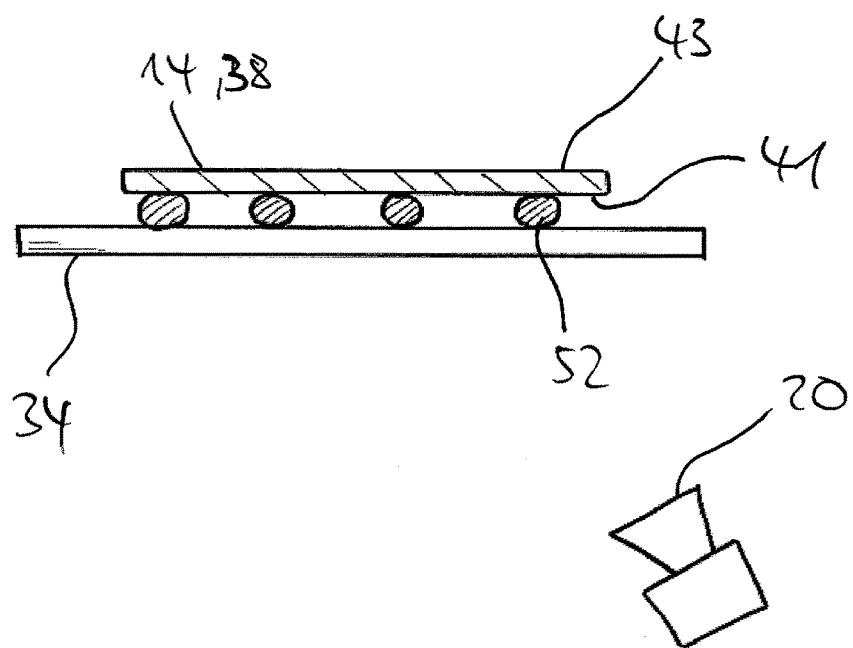
FIG. 2. A section of the device according to the invention in accordance with FIG. 1 in a lateral view with a component arranged on a glass plate.
Figure 3:
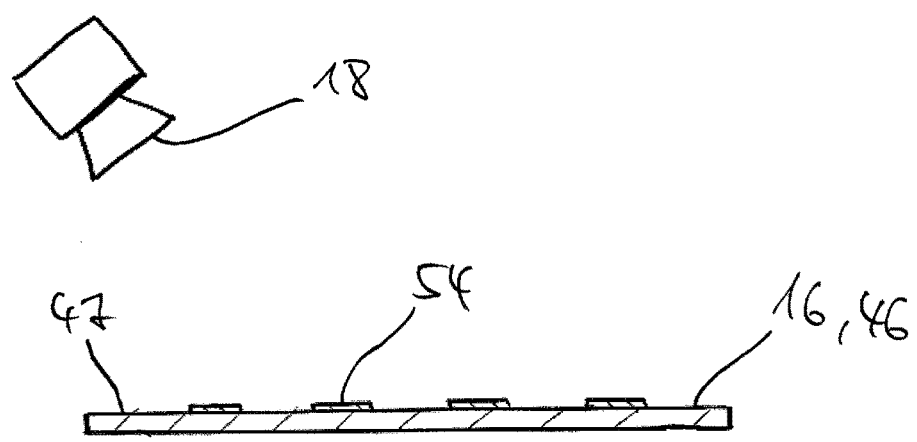
FIG. 3. A section of the device according to the invention in accordance with FIG. 1 in a lateral view with a circuit board.

FIG. 1 shows a schematic representation of the device 10 according to the invention for placing electronic components 14 shown in FIG. 2 onto a circuit board 16 shown in FIG. 3 for teaching or the teach-in of the device 10. The device 10 comprises two cameras 18, 20. The device 10 further comprises a control unit 22 with a storage unit 24.

In addition, the device 10 comprises a gripping device 26 for gripping the components to be placed 14, as well as a drive unit 28 for moving the gripping device 26 along at least three axes. FIG. 1 schematically shows two directions of movement, wherein one direction of movement in a Z direction is indicated by the arrow 30 and wherein a direction of movement in an X or Y direction is indicated by the arrow 32. The drive unit 28 can be controlled by the control unit 22 by means of a data line 29. The gripping device 26 may, for example, comprise a vacuum-operated, low-pressure gripping device.

The device 10 comprises a glass plate 34 for placing the components 14, as well as a circuit board holder 36 for the stationary mounting of the circuit boards 16. For this purpose, the circuit board holder 36 may, for example, comprise retaining clamps not shown in the figures.

The device 10 according to the invention functions as follows:

When components 14 of a first component type are to be placed onto a circuit board 16 of a first circuit board region type, a so-called teaching or teach-in of the device 10 is initially required.

To this end, a reference component 38 of the first component type is manually placed by a user onto the glass plate 34 into a reference starting position 40, which is indicated as dashed in FIG. 1. In the reference starting position 40, a reference component image of the reference component 38 is then created of a component bottom side 41 by means of the first camera 20.

Subsequently, the reference component 38 is gripped by the gripping device 26 at a component top side 43 and moved manually by a user by means of the drive unit 28 along a reference travel path, which consists of a rotation and a translation, from the reference starting position 38 into a reference final position 44 on a reference circuit board 46 of the first circuit board region type, and deposited there. The translation is indicated in FIG. 1 by an arrow 42.

From the reference circuit board 46, which is stationarily mounted in the circuit board holder 36, a reference circuit board region image of the reference circuit board 46 is created of the circuit board top side 47 by means of the second camera 18.

The reference component image, the reference starting position 40, the reference travel path, as well as the reference circuit board region image, are saved in the storage unit 24 of the control unit 22. This step is also called teaching or teach-in.

The movement of the reference component 38 from the reference starting position 40 into the reference final position 44, i.e., the reference travel path, includes a rotation of the reference component 38 about a center of rotation 48 in the direction of the arrow 50 until the position 52—shown in FIG. 1 with a solid line—of the reference component 38 is reached. The movement of the reference component 38 from the reference starting position 40 into the reference final position 44, i.e., the reference travel path, further includes the translation, exemplified in FIG. 1 by the arrow 42, between the centers of rotation 48. In the reference final position 44, the contact surfaces 52 of the reference component 38 are overlaid with contact surfaces 54 of the reference circuit board 46, such that a mutual contact of the contact surfaces 52, 54 takes place, when the reference component 38 is lowered onto the reference circuit board 46 by means of the drive unit 28.

To automatically place a component to be placed 14 of the first component type onto a circuit board 16 of the first circuit board region type, after the teaching or teach-in, a component 14 of the first component type is again placed onto the glass plate 34 into a starting position by a user, as shown in FIG. 2. Subsequently, a component image of the component bottom side 41 is created by means of the first camera 20.

Furthermore, a circuit board 16 of the first circuit board region type is stationarily mounted on the circuit board holder 38, and, as shown in FIG. 3, a circuit board region image of the circuit board 16 of the first circuit board region type is created of the circuit board top side 47.

Subsequently, a travel path for moving the component to be placed 14 from the starting position into a final position on the circuit board 16 is calculated. This calculation is carried out based upon an image overlay—shown schematically in FIG. 4—of the component image in the starting position and the previously saved reference component image in the previously saved reference starting position 40.

The calculation of the travel path is further carried out based upon the previously saved reference travel path of the reference component 38 from the reference starting position 40 into the reference final position 44 on the reference circuit board 46 of the first circuit board region type, which consists of the translation along the arrow 42, as well as the rotation about the center of rotation 48 in the direction of the arrow 50.

Figure 5:
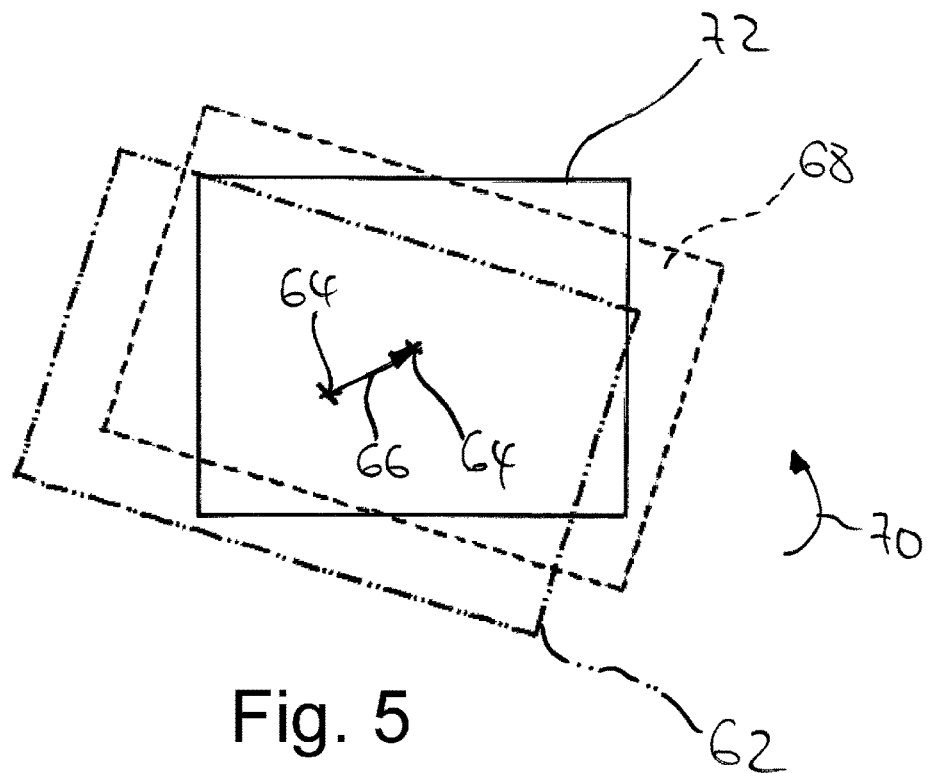
FIG. 5. A schematic representation of the method step of overlaying a circuit board region image with a reference circuit board region image in accordance with the method according to the invention.

In addition, the calculation of the travel path is carried out based upon an image overlay—shown schematically in FIG. 5—of the circuit board region image and the previously saved reference circuit board region image.

Figure 4:
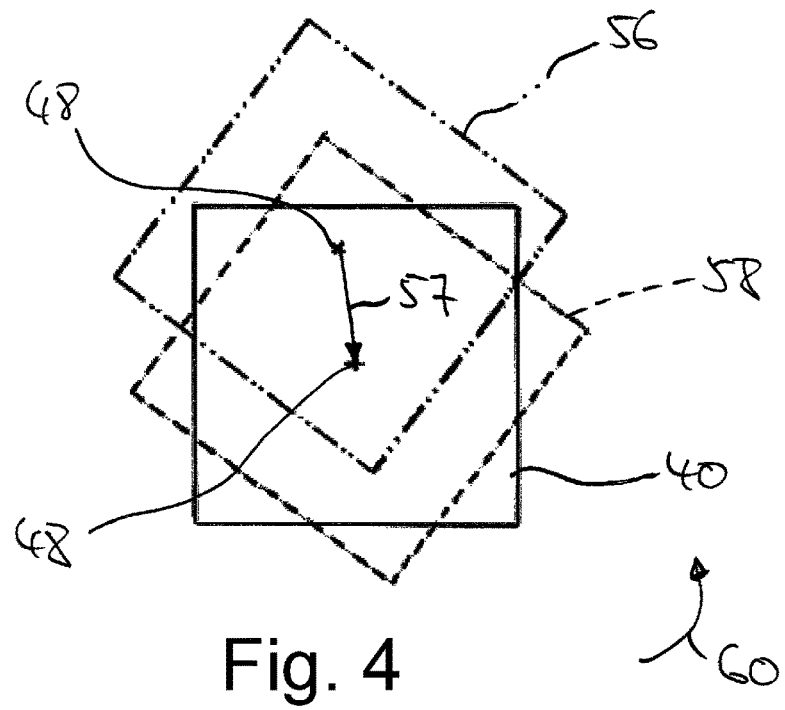
FIG. 4. A schematic representation of the method step for overlaying a component image with a reference component image in accordance with the method according to the invention.

In FIG. 4, a component image 56 of a component 14 to be placed is schematically shown as dot-dashed. On the basis of an image overlay, which is based upon a known image recognition method, a movement consisting of a rotation and a translation is performed.

The center of rotation 48 of the component image 56 is initially overlaid with the center of rotation 48 of the reference component image by a translation, which is indicated by an arrow 57. This intermediate step is shown as dotted in FIG. 4 and is indicated by the reference symbol 58. Subsequently, a rotation about the center of rotation 48 in the direction of the arrow 60 is performed until the component image 56 and the reference component image are precisely overlaid in the reference starting position 40. This situation is indicated with a solid line in FIG. 4.

FIG. 5 in turn shows an analogous overlay of a circuit board region image 62 with the previously saved reference circuit board region image, which is also based upon the known image recognition method. Likewise, a movement consisting of a rotation and a translation is performed.

In this respect, FIG. 5 shows the circuit board region image 62 of a circuit board 16 of the first circuit board region type, which is schematically shown as dot-dashed. A center of rotation 64 of the circuit board region image 62 is initially overlaid with the center of rotation 48 of the reference circuit board region image. This overlay takes place by means of a translation, which is indicated by an arrow 66. This intermediate step is shown as dotted in FIG. 5 and is indicated by the reference symbol 68. Subsequently, a rotation about the center of rotation 64 in the direction of an arrow 70 is performed until the circuit board region image 62 and the reference circuit board region image are precisely overlaid. This situation is shown with a solid line in FIG. 5 and indicated by the reference symbol 72.

The calculation of the travel path is finally performed by means of a coordinate transformation and consists of a rotation and translation of the image overlay of the component image 56 with the reference component image, a rotation and translation of the reference travel path, as well as a rotation and translation of the image overlay of the circuit board region image 62 with the reference circuit board region image.

After calculating the travel path, the circuit board 16 is gripped at the starting position by the gripping device 26 and moved along the travel path in the X/Y direction into the final position on the circuit board 16 by means of the drive unit 28, which is controlled by the control unit 22, and lowered in the Z direction onto the circuit board 16.

Because the image overlay is respectively carried out between a component image 56 and a reference component image of an identical component type, as well as between a circuit board region image 62 and a reference circuit board region image of an identical circuit board region type, external interference with the image overlay can be minimized, whereby an automatic placement of the component 14 onto the circuit board 16 is possible in an easy and precise manner.

Scope of the Invention

It should be understood that, unless stated otherwise herein, any of the features, characteristics, alternatives or modifications described regarding a particular embodiment herein may also be applied, used, or incorporated with any other embodiment described herein. Also, the drawing herein is not drawn to scale. Although the invention has been described and illustrated with respect to exemplary embodiments thereof, the foregoing and various other additions and omissions may be made therein and thereto without departing from the spirit and scope of the present invention.

The invention claimed is:

1. A method for placing electronic components onto a circuit board, comprising the following steps:
    Placing a component of a first component type into a starting position;
    Creating a component image of the component;
    Creating a circuit board region image of a circuit board of a first circuit board region type;
    Calculating a travel path for moving the component from the starting position into a final position on the circuit board based upon the following:
        an image overlay of the component image and a previously saved reference component image of a reference component of the first component type,
        a previously saved reference starting position, a previously saved reference travel path of the reference component from a previously saved reference starting position into a reference final position on a reference circuit board of the first circuit board region type, and
        a corresponding image overlay of the circuit board region image and a previously saved reference circuit board region image of the reference circuit board;
    Moving the component along the travel path into the final position; and
    performing the calculation of the travel path by means of a coordinate transformation, which consists of a first rotation and translation of the image overlay of the component image and the previously saved reference component image, a second rotation and translation of the previously saved reference travel path, as well as a third rotation and translation of the image overlay of the circuit board region image and the previously saved reference circuit board region image.

2. The method according to claim 1, characterized in that the method comprises: creating a reference component image prior to saving the previously saved reference component image and the previously saved reference starting position; placing the reference component into the reference starting position; moving the reference component along the reference travel path from the previously saved reference starting position into the reference final position on the reference circuit board; and saving the reference travel path when the reference component arrives at the reference final position.

3. The method according to claim 2, characterized in that the method comprises moving the reference component manually from the reference starting position into the reference final position.

4. The method according to claim 1, characterized in that the method comprises gripping and lifting the component by a gripping device prior to being moved.

5. The method according to claim 1, characterized in that the method comprises depositing, after the movement, the component onto the circuit board into the final position, or dropping the component into the final position on the circuit board.

6. The method according to claim 1, characterized in that the method comprises placing the component into the starting position on a glass plate.

7. The method according to claim 1, characterized in that the method comprises taking the component image and the reference component image of a component bottom side.

8. The method according to claim 1, characterized in that the method comprises taking the circuit board region image and the reference circuit board region image of a circuit board top side.

9. The method according to claim 1, characterized in that the method comprises creating the component image of the component and/or the reference component image of the reference component in the starting position.

10. A device for placing electronic components, which performs the method according to claim 1, characterized in that the device comprises one or more cameras designed to create the component image, the reference component image, the circuit board region image, and the reference circuit board region image; a control unit designed to calculate the travel path, the control unit comprising a storage unit designed to store the reference component image, the reference starting position, the reference travel path, and the reference circuit board region image; a gripping device for gripping one or more components to be placed.

11. The device according to claim 10, characterized in that the device comprises a drive unit that is designed to move the gripping device along the travel path.

12. The device according to claim 10, characterized in that the gripping device comprises a vacuum-operated, low-pressure gripping device.

13. The device according to claim 10, characterized in that the device comprises a glass plate for placing the one or more components into the starting position.

14. The device according to claim 10, characterized in that the device comprises a circuit board holder that is designed for a stationary mounting of one or more circuit boards.

15. The method according to claim 2, characterized in that the method comprises performing the calculation of the travel path by means of a coordinate transformation, which consists of a first rotation and translation of the image overlay of the component image and the previously saved reference component image, a second rotation and translation of the previously saved reference travel path, as well as a third rotation and translation of the image overlay of the circuit board region image and the previously saved reference circuit board region image.

16. The method according to claim 2, characterized in that the method comprises gripping and lifting the component by a gripping device prior to being moved.

17. The method according to claim 2, characterized in that the method comprises depositing, after the movement, the component onto the circuit board into the final position, or dropping the component into the final position on the circuit board.

18. The method according to claim 2, characterized in that the method comprises placing the component into the starting position on a glass plate.

19. The method according to claim 2, characterized in that the method comprises taking the component image and the reference component image of a component bottom side.

* * * * *